US006779010B2

(12) United States Patent
Humphreys et al.

(10) Patent No.: US 6,779,010 B2
(45) Date of Patent: Aug. 17, 2004

(54) ACCUMULATOR WITH PROGRAMMABLE FULL-SCALE RANGE

(75) Inventors: Scott Robert Humphreys, Greensboro, NC (US); Alex Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 616 days.

(21) Appl. No.: 09/879,808

(22) Filed: Jun. 12, 2001

(65) Prior Publication Data

US 2002/0198912 A1 Dec. 26, 2002

(51) Int. Cl.$^7$ .................................................. G06F 7/38
(52) U.S. Cl. ...................................................... 708/490
(58) Field of Search .............................. 708/313, 444, 708/490, 670, 700

(56) References Cited

U.S. PATENT DOCUMENTS 3,538,450 A  11/1970  Andrea et al.
4,609,881 A   9/1986  Wells (List continued on next page.)

OTHER PUBLICATIONS

Dunning et al., "An All–Digital Phase–Locked Loop with 50–Cycle Lock Time Suitable for High–Performance Microprocessors," IEEE Journal of Solid–State Circuits, vol. 30, No. 4, Apr. 1999, pp. 412–422.

Kral et al., "RF–CMOS Oscillators with Switch Tuning," Proceedings of the IEEE 1998 Custom Integrated Circuits Conference, May 1998, pp. 555–558.

Miller, Brian and Conley, Robert J., "A Multiple Modulator Fractional Divider," IEEE Transactions on Instrumentation and Measurement, vol. 40, No. 3, Jun. 1991, pp. 578–583.

Wilson et al., "CMOS Self–Calibrating Frequency Synthesizer," IEEE Journal of Solid–State Circuits, vol. 35, No. 10, Oct. 2000, pp. 1437–1444.

Chang, Byngsoo, et al. "A 1.2 GHz CMOS Dual–Modulus Prescaler Using New Dynamic D–Type Flip–Flops," IEEE Journal of Solid–State Circuits, vol. 31, No. 5, May, 1996, pp. 749–752.

Huang, Qiuting, and Rogenmoser, Robert, "Speed Optimization of Edge–Triggered CMOS Circuits for Gigahertz Single–Phase Clocks," IEEE Journal of Solid–State Circuits, vol. 31, No. 3, Mar., 1996, pp. 456–465.

Motorola Semiconductor Technical Data, "The Technique of Direct Programming by Using a Two–Modolus Prescaler," Originally printed May 1981, reformatted Oct. 1995, Document No. AN827/D.

Owen, David, "Fractional–N Synthesizers," IFR Application Note, IFR Americas, 2001, www.ifrsys.com.

Pohjonen, H. and Ronkainen, H., "A 1 GHz CMOS Prescaler for RF Synthesizers," 1988 Proceedings of ISCAS, pp. 377–380, CH2458–8/88/0000–0377.

Rogenmoser, R. et al., "1.57 GHz Asynchronous and 1.4 GHz Dual–Modulus 1.2 micrometer CMOS Prescalers," IEEE Customer Integrated Circuits Conference, 1994, pp. 387–390, 0–7803–1886–2/94.

(List continued on next page.)

Primary Examiner—Chuong Dinh Ngo
(74) Attorney, Agent, or Firm—Withrow & Terranova, PLLC

(57) ABSTRACT

A fractional sequence generator for use in a F-N synthesizer includes a multi-accumulator structure providing a plurality of carry-out signals for application to an adder through a recombination network to generate an output fractional sequence, S, having an average value given by avg(S)=C/D, where C/D is the desired fractional part of the divisor, and denominator, D, is programmable. Illustratively, contents of a n-bit accumulator in each accumulator is augmented by a function of the programmable denominator value upon a carry-out of the associated n-bit adder in that accumulator.

15 Claims, 3 Drawing Sheets

U.S. PATENT DOCUMENTS

| | | |
|---|---|---|
| 4,875,046 A | 10/1989 | Lewyn |
| 4,920,282 A | 4/1990 | Muraoka et al. |
| 4,953,187 A | 8/1990 | Herold et al. |
| 4,965,474 A | 10/1990 | Childers et al. |
| 4,965,531 A | 10/1990 | Riley |
| 4,991,187 A | 2/1991 | Herold et al. |
| 5,022,054 A | 6/1991 | Wang |
| 5,038,117 A | 8/1991 | Miller |
| 5,055,800 A | 10/1991 | Black et al. |
| 5,055,802 A | 10/1991 | Hietala et al. |
| 5,058,427 A | 10/1991 | Brandt |
| 5,068,875 A | 11/1991 | Quintin |
| 5,070,310 A | 12/1991 | Hietala et al. |
| 5,079,522 A | 1/1992 | Owen et al. |
| 5,093,632 A | 3/1992 | Hietala et al. |
| 5,111,162 A | 5/1992 | Hietala et al. |
| 5,117,206 A | 5/1992 | Imamura |
| 5,166,642 A | 11/1992 | Hietala |
| 5,235,335 A | 8/1993 | Hester et al. |
| 5,281,865 A | 1/1994 | Yamashita et al. |
| 5,301,367 A | 4/1994 | Heinonen |
| 5,337,024 A | 8/1994 | Collins |
| 5,341,033 A | 8/1994 | Koker |
| 5,365,548 A | 11/1994 | Baker |
| 5,493,700 A | 2/1996 | Hietala et al. |
| 5,493,715 A | 2/1996 | Humphreys et al. |
| 5,495,206 A | 2/1996 | Hietala |
| 5,552,738 A | 9/1996 | Ko |
| 5,563,532 A | 10/1996 | Wu et al. |
| 5,592,114 A | 1/1997 | Wu et al. |
| 5,684,795 A | 11/1997 | Daniel et al. |
| 5,745,848 A | 4/1998 | Robin |
| 5,777,521 A | 7/1998 | Gillig et al. |
| 5,778,028 A | 7/1998 | Turner |
| 5,822,366 A | 10/1998 | Rapeli |
| 5,825,257 A | 10/1998 | Klymyshyn et al. |
| 5,857,004 A | 1/1999 | Abe |
| 5,859,890 A | 1/1999 | Shurboff et al. |
| 5,883,930 A | 3/1999 | Fukushi |
| 5,892,385 A | 4/1999 | Hashiguchi |
| 5,898,330 A | 4/1999 | Klass |
| 5,900,758 A | 5/1999 | Kanno |
| 5,917,355 A | 6/1999 | Klass |
| 5,920,556 A | 7/1999 | Jorgensen |
| 5,933,038 A | 8/1999 | Klass |
| 5,943,613 A | 8/1999 | Wendelrup et al. |
| 5,973,633 A | 10/1999 | Hester |
| 6,008,703 A | 12/1999 | Perrott et al. |
| 6,008,704 A | 12/1999 | Opsahl et al. |
| 6,043,696 A | 3/2000 | Klass et al. |
| 6,060,927 A | 5/2000 | Lee |
| 6,064,272 A | 5/2000 | Rhee |
| 6,097,259 A | 8/2000 | Saito et al. |
| 6,100,730 A | 8/2000 | Davis |
| 6,121,807 A | 9/2000 | Klass |
| 6,154,077 A | 11/2000 | Waible |
| 6,163,710 A | 12/2000 | Blaser et al. |
| 6,275,083 B1 | 8/2001 | Martinez et al. |
| 6,323,709 B1 | 11/2001 | Kulkarni et al. |

OTHER PUBLICATIONS

Yang, Ching–Yuan, and Liu, Shen–Iuan, "Fast–Switching Frequency Synthesizer with a Discriminator–Aided Phase Detector," IEEE Journal of Solid–State Circuits, vol. 35, No. 10, Oct. 2000, pp. 1445–1452, 0018–9200/00.

Yuan, Jiren, and Svensson, Christer, "High–Speed CMOS Circuit Technique," IEEE Journal of Solid–State Circuits, vol. 24, No. 1, Feb. 1989, pp. 62–70, 0018–9200/89.

Yuan, Jiren and Svensson, Christer, "New Single–Clock CMOS Latches and Flipflops with Improved Speed and Power Savings," IEEE Journal of Solid–Stae Circuits, vol. 32, No. 1, Jan. 1997, pp. 62–69, 0018–9200/97.

Razavi, Behzad, "RF Microelectronics," Prentice Hall PTR, Upper Saddle River, NJ, 1998.

ACCUMULATOR WITH PROGRAMMABLE FULL-SCALE RANGE

RELATED APPLICATIONS

The present application is related to concurrently filed non-provisional applications:

(i) by A. W. Hietala entitled *Fractional-N Modulation with Analog IQ Interface;*

(ii) by B. T. Hunt and S. R. Humphreys entitled *Dual-Modulus Prescaler;*

(iii) by S. R. Humphreys and A. W. Hietala entitled *Fractional-N Synthesizer with Improved Noise Performance;* and (iv) by B. T. Hunt and S. R. Humphreys entitled *True Single-Phase Flip-Flop,* which non-provisional applications are assigned to the assignee of the present invention, and are hereby incorporated in the present application as if set forth in their entirety herein.

FIELD OF THE INVENTION

The present invention relates to digital electronic circuitry. More particularly, the present invention relates to digital accumulators. Still more particularly, the present invention relates to digital accumulators for use in fractional-N (F-N) synthesizers.

BACKGROUND OF THE INVENTION

Phase-locked loop (PLL) frequency synthesis is a well-known technique for generating a variety of signals of predetermined frequency in many applications, e.g., digital radiotelephone systems. Briefly, the output of a voltage-controlled oscillator (VCO) is coupled to a frequency divider for providing one input to a phase detector. Another input to the phase detector is a reference signal from a fixed frequency source having high stability over a range of operating conditions. Differences in phase determined by the phase detector (typically reflected as charge pulses) are then filtered and applied to the VCO to control changes to the frequency of the VCO of such magnitude and sign as to reduce the detected phase difference.

Fractional-N (F-N) synthesizers based on the above-described PLL frequency synthesis techniques have been in favor for some time because, inter alia, they provide for non-integer division of the VCO output, thereby providing greater flexibility in choosing the VCO output frequency, and allowing the use of higher frequency reference sources with the concomitant potential for wider bandwidth and faster loop locking times. Other background aspects of RF synthesizers (and, in particular, F-N synthesizers), and their implementation and use, are presented in B. Razavi, *RF Microelectronics,* Prentice-Hall PTR, 1998, especially pp. 269–297, and in incorporated related patent application (i-v) cited above.

FIG. 1 shows a prior art F-N synthesizer arrangement in which a reference signal, e.g., from stable frequency source is applied on input 135 as one input to a phase detector 130. The other input to phase detector 130 is a frequency divided output from programmable divider 120 on path 125. Divider 120, in turn, receives an input from the output of VCO 100, which output is the frequency-controlled output of the synthesizer of FIG. 1. The integer part of the division ratio is applied on line 175 and input reflecting the fractional part of the division ratio is applied on line 155. More specifically, fractional sequence generator 150 responds to an applied fractional divisor input on lead 170 to provide a time-variable sequence of integer values, which, when applied through adder 160 allow a variable divisor to be realized in divider 120. Typically, fractional sequence generator 150 is clocked by the output of divider 120, and a new instantaneous divisor value is provided for each cycle of that clock. The overall effect of the application of this time-varying integer divisor in divider 120 is to apply a divisor to divider 120 that has an average value equal to the sum of the integer and fractional inputs on 175 and 170, respectively.

In operation, the prior art synthesizer of FIG. 1 controls the frequency of VCO 100 in response to varying integer divisors by applying a time-variable frequency divided version of the output from VCO 100 to phase detector 130. In comparing phase information for the frequency divided input from divider 120 with the reference signal on input 135, phase detector 130 develops an error signal that is smoothed in low pass loop filter 140 and applied to VCO 100 in such manner as to reduce the phase error between the reference signal and the frequency divided signal from divider 120. In doing so, the output from VCO 100 tracks the desired frequency variations specified by fractional inputs on input 170.

Overall, if the desired fractional output of the divider is represented as a numerator, C, and a denominator, D, then the output sequence, SEQ, from sequence generator 150 in FIG. 1 is given by $$avg(SEQ)=C/D,$$

where avg) represents an averaging operation. When SEQ is added to the integer value appearing on 175 in FIG. 1, the instantaneous value of the divisor is given by $$N[i]=N_{int}+SEQ[i],$$

where SEQ[i] is the instantaneous value of the sequence and $N_{int}$ is the integer portion of the divisor presented on 175. Thus, the average of total divisor value N is given by $$avg(N)=N_{int}+avg(SEQ)=N_{int}+C/D.$$

The fractional-n PLL then locks the VCO 100 in FIG. 1 to the frequency $$F_{vco}=F_{ref}(N_{int}+C/D),$$

which has a resolution or step size given by $$F_{step}=F_{ref}/D.$$

FIG. 2 shows a prior art fractional sequence generator 200 based generally on aspects of a F-N synthesizer circuit arrangement shown in U.S. Pat. No. 4,609,881 issued Sep. 2, 1986 to J. N. Wells, which patent is hereby incorporated by reference as if set forth in its entirety herein. The sequence generator of FIG. 2 includes an accumulator structure 210 having a plurality of accumulators—each comprising an n-bit bank of D flip-flops (an n-bit register), 230-*i*, i=1, 2, and 3 and a corresponding n-bit adder 225-*i*, i=1, 2, and 3. Adder 225-1 receives a fractional divisor value f (the least significant bits of a divisor of the form N.f, where N is an integer) on the C input path 215 during a current clock cycle of the output of divider 120. Clock signals corresponding to the output of divider 120 are provided as inputs on $F_v$ input 220. The value f on input 215 is added to the previous contents of n-bit register 230-1 and the result is stored in register 230-1. In addition, when register 230-1 overflows (provides a carry-out indication on recombination output CO1), that signal is immediately applied to adder 240 at an input labeled +1. The set of recombination paths is conveniently referred to as recombination network 205.

As further shown in FIG. 2, the sum stored in register 230-1 is also provided as an input to adder 225-2, where it is combined with the prior contents of register 230-2 during the following clock cycle. Again, the result of the addition is stored back in register 230-2 and a carry indication is provided on recombination path CO2 when overflow of adder 230-2 occurs is applied to an input to adder 240 labeled +1. In addition, the same overflow signal on CO2 is applied to a −1 input to adder 240 after a delay of one additional clock cycle. Such additional delay of one clock cycle is provided by delay flip-flop 250.

In similar fashion, adder 230-3 receives the result of the addition performed at adder 230-2 and adds it to the prior contents of register 230-3. Again, the result of the addition is stored back to register 230-3, and, when a carry-out occurs from adder 225-3, recombination path CO3 supplies the carry-out signal to a +1 input to adder 240. In addition, the CO3 recombination path provides the carry-out indication to delay flip-flop 260, thereby providing the carry out signal to a −2 input to adder 240 after an additional clock cycle. Further, the delayed CO3 signal on the output of flip-flop 260 is also provided as an input to delay flip-flop 270 where it provides the carry-out signal to a +1 input to adder 240 after yet another clock cycle (a total delay of two clock cycles).

Each of the carry-out signals from adders 225-$i$ causes adder 240 to provide an output on SEQ path 245 to temporarily increment or decrement the integer divisor applied through adder 160 to divider 120 in FIG. 1. The magnitude and sign of an increment or decrement during any clock cycle is determined as the sum of increments and decrements indicated by the weights for all recombination paths supplying carry-out signals during that clock cycle. The weights correspond to sequences associated with a Pascal's Triangle. These integer divisor changes advantageously average to the desired fractional portion over time. See further the discussion of Pascal sequence coefficients in incorporated U.S. Pat. No. 4,609,881.

In the accumulator structure 210 of the fractional sequence generator of FIG. 2, the denominator, D, is equal to the range (max value-min value) of the digital adders 225-$i$. When the number of bits in D is n, then D=$2^n$. Thus, the accumulator structure of FIG. 2 typically forces the denominator to assume a fixed value. If the number of bits in the adder can be selected, then different values, all equal to a power of 2 can be achieved. However, many applications of F-N synthesizers, e.g., those employing automatic frequency control (AFC) and/or digital modulation, desirably include greater flexibility in the selection of frequency resolution or frequency step size than is provided using prior art dividers. Otherwise, additional scaling operations become necessary in other parts of an overall system and, especially in AFC applications, gain of the control loop depends in part on frequency step size. It is therefore desired that a F-N synthesizer include a fractional sequence generator with an accumulator structure having a variable or programmable denominator, without also significantly increasing circuit complexity, delay, and power consumption.

SUMMARY OF THE INVENTION

Limitations of the prior are overcome and a technical advance is made in accordance with the present invention, typical embodiments of which are described below.

In accordance with one illustrative embodiment of the present invention a fractional sequence generator for use in a F-N synthesizer comprises a multi-accumulator structure providing a plurality of carry-out signals for application to an adder through a recombination network, thereby to generate an output fractional sequence, SEQ (hereinafter, S), having an average value given by avg(S)=C/D, where C/D is the desired fractional part of the divisor. Advantageously, the denominator, D, is programmable as a value not restricted to powers of 2 or other particular value.

In accordance with an aspect of illustrative embodiments of the present invention, contents of a n-bit accumulator in each of the accumulators is augmented by a function of the programmable denominator value upon a carry-out of the associated n-bit adder in that accumulator. Illustratively, for a given denominator, D, the offset applied upon carry-out of the accumulator is chosen as $2^n$−D. This offset is conveniently generated at the ith accumulator using a multiplexer supplying a value of $2^n$−1 when the carry-out from the ith accumulator assumes a logical 1 value, and supplying a zero value otherwise. The output of the multiplexer, in turn, is conveniently summed in an adder with the current contents of the n-bit register storing the accumulator contents (after rollover). A result of augmenting accumulator values in accordance with the programmable function of D is that rollover timing can be selected to achieve any desired C/D.

BRIEF DESCRIPTION OF THE DRAWING

The above-summarized invention will be more fully understood upon consideration of the following detailed description and the attached drawing wherein.

DETAILED DESCRIPTION

The following detailed description and accompanying drawing figures depict illustrative embodiments of the present invention. Those skilled in the art will discern alternative system and method embodiments within the spirit of the present invention, and within the scope of the attached claims, from consideration of the present inventive teachings.

Figure 2:
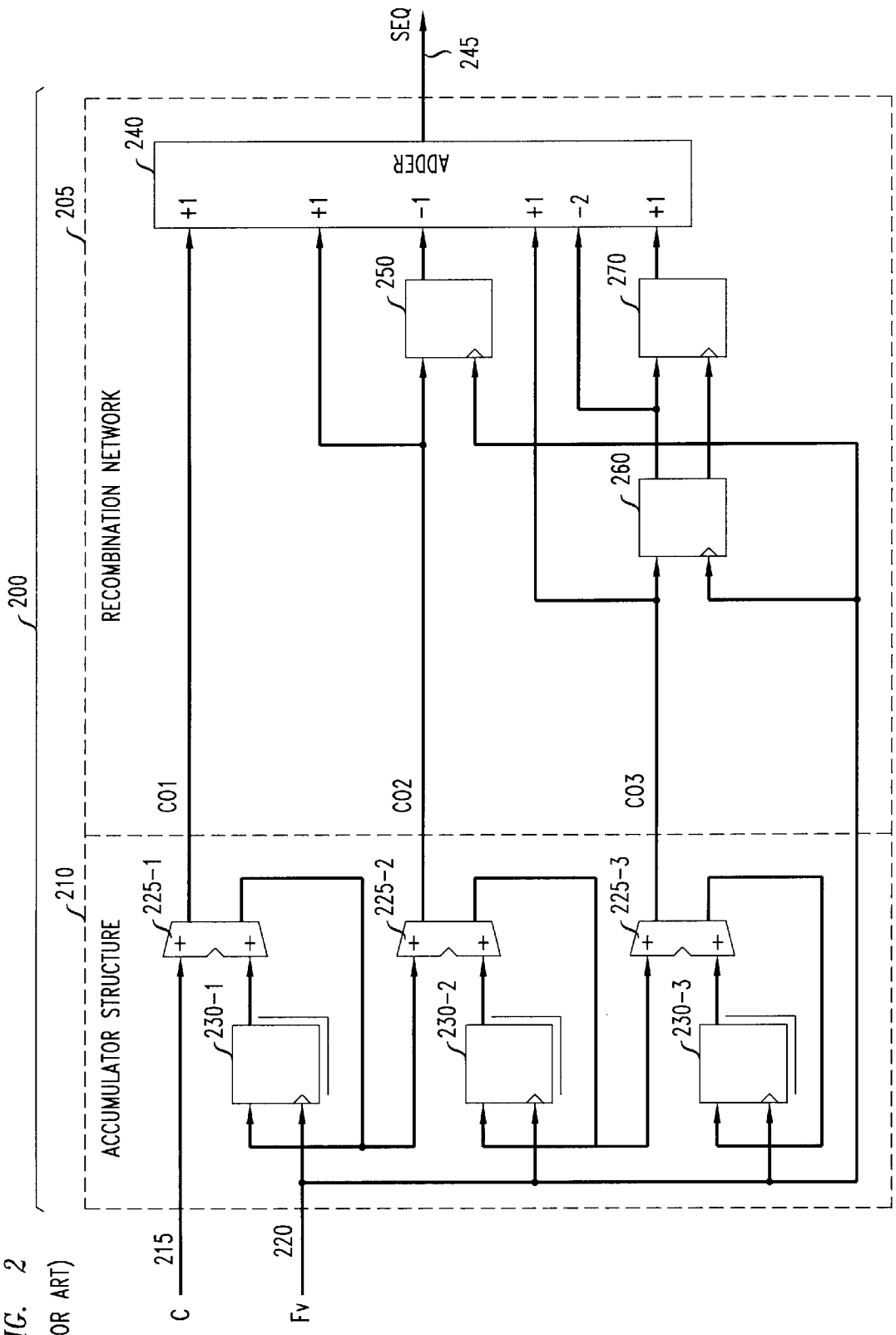
FIG. 2 shows a prior art fractional sequence generator for use in the F-N synthesizer of FIG. 1.
Figure 3:
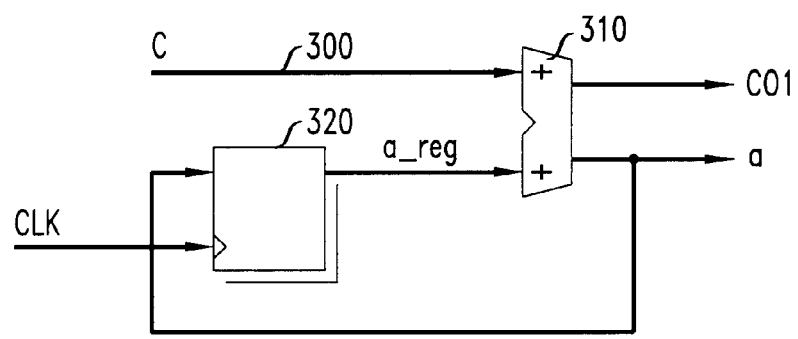
FIG. 3 shows the prior art accumulator structure used in the fractional sequence generator of FIG. 2.
Figure 4:
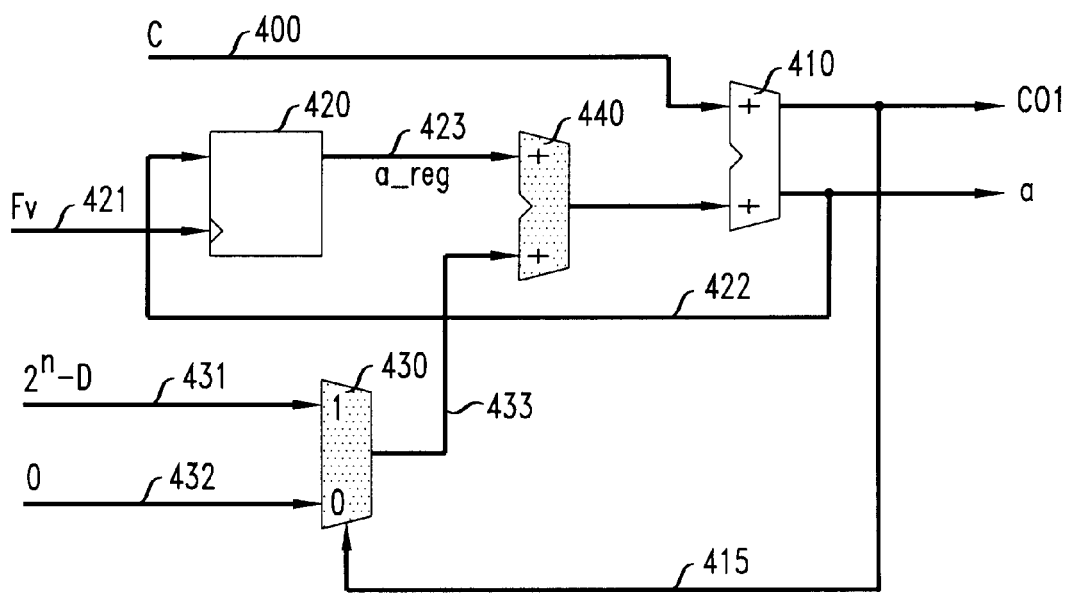
FIG. 4 shows a modified accumulator structure in accordance with an illustrative embodiment of the present invention.

FIG. 3 shows an accumulator combination from the fractional sequence generator of FIG. 2 for convenience of reference and for contrast with an illustrative embodiment of the present inventive accumulator structure shown in FIG. 4.

In the accumulator of FIG. 3, a word representative of the fractional part, C, of a desired divisor to be used in divider 120 is presented on bus 300 to adder 310. The other input to the circuit of FIG. 3 is a clock signal applied to register 320. Output of the register appears as a_reg, and is applied as a second (bus) input to adder 310. Outputs of adder 310 are a, the modulo $2^n$ sum of the values of C and a_reg, and CO the carry-out bit for adder 310. CO1 is shown, reflecting the carry-out for the first accumulator in the accumulator structure of FIG. 2. Busses for C, a_reg, and a are normally of the same width, thus permitting values for the a output ranging from 0 to $2^n$−1, where n is the number of paths in each bus.

For each cycle, illustratively upon a rising edge of the clk clock signal, the contents of register 320 is updated to the output of adder 310 after the previous add operation. In typical operation, the value of C will be updated once per clock cycle as well. If the addition of C and a_reg exceeds the maximum value of the adder (2–1), then a carry-out will occur: CO1 will be high and the contents of register 320 is the aforementioned modulo $2^n$ sum of its inputs. So, for example, if the width of the bus is 3 bits, $2^n-1$ is 7 (and the minimum value for a_reg is 0), and if C=a_reg=4, then CO1=1 and a will have a value of 0. This example illustrates a rollover of the accumulator.

Table 1 illustrates the operation of the circuit of FIG. 3 for n=C=3. This corresponds to an accumulator with 3-bit busses, a fractional-part word, C, having a value of 011, and adder output values ranging from 0 to 7.

TABLE 1

| Cycle | a_reg | a | CO1 |
|---|---|---|---|
| initial | 0 | 3 | 0 |
| 1 | 3 | 6 | 0 |
| 2 | 6 | 1 | 1 |
| 3 | 1 | 4 | 0 |
| 4 | 4 | 7 | 0 |
| 5 | 7 | 2 | 1 |
| 6 | 2 | 5 | 0 |
| 7 | 5 | 0 | 1 |

In the above example the cycle repeats after eight clock cycles, where eight is the number of possible accumulator (adder) values. A 1 appears on the CO1 output three (out of eight) times, a number equal to the input value C. This illustrates the usage numerator for the value C, and denominator for the value of D. It will be appreciated that the average value of output on CO1 is 3/8.

Figure 1:
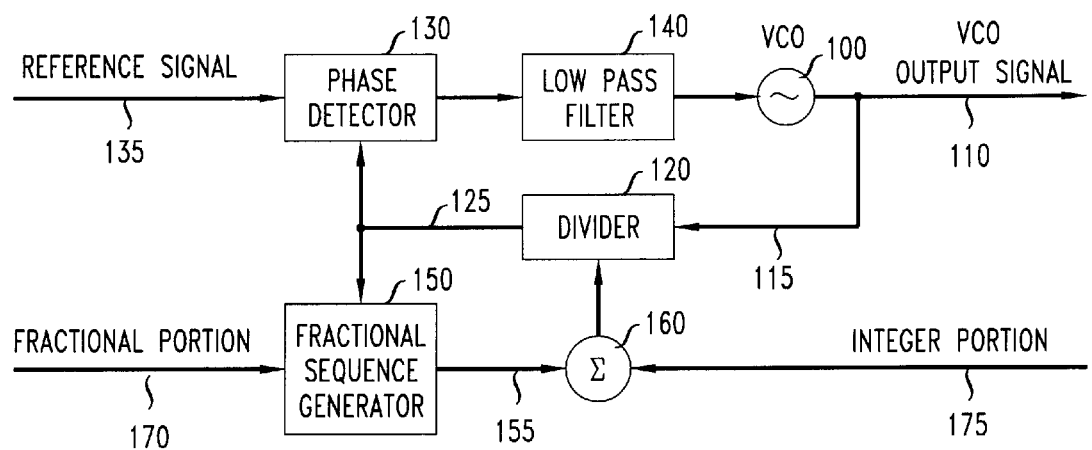
FIG. 1 shows a prior art fractional-N (F-N) synthesizer.

To achieve increased resolution and flexibility in controlling the value of a divisor in a F-N synthesizer of the type shown in FIG. 1, and for other applications, a programmable denominator having a full range of possible values is desired. In accordance with one aspect of the present invention, the constraint of having values of D assume only one of $2^n$ values is avoided in a programmable-denominator accumulator having the required flexibility.

To achieve such programmability for denominator D, the accumulator structure is advantageously modified to permit rollover at an appropriate value. In accordance with one embodiment of the present invention requiring a minimum of additional circuitry, it proves advantageous to preset an accumulator with a value equal to the difference between the full-scale value of the accumulator and a desired denominator. The accumulator will then accumulate (starting from the preset value) and will rollover when the desired value has been added to the preset value. The preset value is entered after each rollover. Thus, in effect, the accumulator is shortened by an amount necessary to emulate an accumulator with the desired denominator or full scale range.

Table 2 illustrates the functioning of a hypothetical accumulator arrangement for values of D=5, C=3.

TABLE 2

| Cycle | a_reg | a | CO1 |
|---|---|---|---|
| initial | 0 | 3 | 0 |
| 1 | 3 | 1 | 1 (sum = 6, rollover at 5 with remainder of 1) |
| 2 | 1 | 4 | 0 |
| 3 | 4 | 2 | 1 (sum = 7, rollover at 5 with remainder of 2) |
| 4 | 2 | 0 | 1 (sum = 5, rollover at 5 with remainder of 0) |
| 5 | 0 | 3 | 0 |
| 6 | 3 | 1 | 1 (sum = 6, rollover at 5 with remainder of 1) |
| 7 | 1 | 4 | 0 |
| ... | | | |

The operations of Table 2 are now to be compared with an accumulator for D=5, C=3 using an accumulator for a full-scale value of 8 with an initial (preset) value of 3 (the full-range of 8 minus D=5).

TABLE 3

| Cycle | a_reg | a | CO1 |
|---|---|---|---|
| initial | 3 | 6 | 0 (start a_reg at offset of 3) |
| 1 | 6 | 1 | 1 (sum = 9, rollover at 8 with remainder of 1) |
| 2 | 4 | 7 | 0 (add offset of 3) |
| 3 | 7 | 2 | 1 (sum = 10, rollover at 8 with remainder of 2) |
| 4 | 5 | 0 | 1 (add offset of 3; sum = 8, rollover at 8 with remainder of 0) |
| 5 | 3 | 6 | 0 (add offset of 3) |
| 6 | 6 | 1 | 1 (sum = 9, rollover at 8 with remainder of 1) |
| 7 | 4 | 7 | 0 (add offset of 3). |
| ... | | | |

It will be noted that the output (carryout) sequence is 0101101011 . . . , which has the desired C/D value of 3/5.

FIG. 4 shows a programmable accumulator in accordance with a preferred embodiment of the present invention. Shown there are some of the former accumulator structure elements-identified here as: register 420 receiving a clock signal, $F_y$, and a feedback path for applying a current sum back to the register; and adder 410 for performing the addition of the C input word with an input reflecting (in part) the content of register 420.

In addition, the accumulator arrangement of FIG. 4 shows (in crosshatched representation) multiplexer 430 and adder 440. Consistent with the examples and process flow described above in connection with Tables 2 and 3, multiplexer 430 receives a programmable input $2^n-D$ on input 431 and a constant input of zero on input 432. One of these inputs is provided as an output of multiplexer 430 in response to a gating signal on path 415 provided by the CO1 output from adder 410; when a carryout (CO1=1) occurs at adder 410 $2^n-D$ is output, otherwise zero is output. The output of multiplexer 430 is applied on path 433 to adder 440, with adder 440 receiving its other input from the a_reg output of register 420 (on path 423). Adder 440 then provides a sum on its output equal to $2^n-D$ (or zero) and the current contents of register 420.

Since the accumulation in register 420 is, in effect, enhanced by the programmable value $2^n-D$ whenever a rollover is indicated at adder 410, sums formed in adder 410 will produce a carryout on the CO1 output $2^n-D$ clock cycles earlier than would be the case for an adder receiving only C and a_reg inputs.

While the above detailed description has used the first of the series of cascaded accumulators, and its outputs a and CO1, by way of illustration, it will be understood that the same circuit principles will be applied to CO2 and CO3 (and other cascaded accumulators when present). In each case the output $a_i$ is applied as the input to register 420-(i+1), as for outputs from one accumulator 225-$i$ in FIG. 2.

As will be appreciated by those skilled in the art, the value for D (hence $2^n-D$) reflecting divider step size or resolution can be chosen to meet requirements of a number of applications. Suitable applications based on the present inventive teachings will include a variety of digital modulation, automatic frequency control and other applications where a particular denominator value proves useful or necessary. More particularly, applications of teachings in incorporated applications (i) and (iii) above—for *Fractional-N Modulation with Analog IQ Interface and Fractional-N Synthesizer with Improved Noise Performance*—will, in appropriate cases, employ present inventive teachings to advantage.

What is claimed is:

1. An accumulator structure receiving a clock signal with period $1/F_v$, the accumulator structure comprising
 a cascaded plurality of n-bit accumulators, $A_i$, each adding a multi-bit input word to a previously accumulated value to provide a new n-bit sum, $N_i$, and a binary carry-out signal, $CO_i$, where $CO_i=1$ when said $N_i$ overflows said n-bit accumulator, said multi-bit input word for $A_i$ comprising
 (i) a fractional-part word, C, for i=1,
 (ii) $N_{i-1}$ for i>1,
 each $A_i$ further comprising an offset circuit for incrementing said $N_i$ by a programmable function of a given value, D, in response to each occurrence of $CO_i=1$.

2. The accumulator structure of claim 1 wherein said programmable function is given by $2^n-D$.

3. The sequence generator of claim 2 wherein $2^n-D$ is not a power of 2.

4. The accumulator structure of claim 1 wherein each $A_i$ comprises
 a n-bit register storing said $N_i$, and
 a first n-bit adder for forming the sum of said multi-bit input word and
 (i) $N_i$ when $CO_i=0$, or
 (ii) $N_i+2n-D$ when $CO_i=1$.

5. The accumulator structure of claim 4 further comprising
 a second n-bit adder having said $N_i$ as a first input,
 a multiplexer responsive to an occurrence of $CO_i=1$ for supplying a value $2^n-D$ as a second input to said second n-bit adder, and responsive to a 0 value for said $CO_i$ for supplying a zero value as a second input to said second n-bit adder.

6. A fractional sequence generator receiving a fractional-part word, C, and a clock signal with period $1/F_v$,
 a cascaded plurality of n-bit accumulators, $A_i$, each adding a multi-bit input word to a previously accumulated value to provide a new n-bit sum, $N_i$, and a carry-out signal, $CO_i$, when said $N_i$ overflows said n-bit accumulator,
 an adder providing an output value, S, for each cycle of said clock signal, where S is equal to a sum of weighted increments and decrements, each increment and decrement associated with a respective selectively delayed replica of one of said $CO_i$, the average value for S is given by avg(S)=C/D for a given value of D, and wherein
 each $A_i$ further comprises an offset circuit for incrementing said $N_i$ by a programmable function of D in response to each occurrence of said $CO_i$.

7. The sequence generator of claim 6 wherein said programmable function is given by $2^n-D$.

8. The sequence generator of claim 7 wherein $2^n-D$ is not a power of 2.

9. The sequence generator of claim 8 wherein each $A_i$ comprises
 a n-bit register storing said $N_i$, and
 a first n-bit adder for forming the sum of C and
 (i) $N_i$ when $CO_i=0$, or
 (ii) $N_i+2^n-D$ when $CO_i=1$.

10. The sequence generator of claim 9 further comprising
 a second n-bit adder having said $N_i$ as a first input,
 a multiplexer responsive to a 1 value for said $CO_i$ for supplying a value of $2^n-D$ as a second input to said second n-bit adder, and responsive to a 0 value for said $CO_i$ for supplying a zero value as a second input to said second n-bit adder.

11. A fractional-N (F-N) synthesizer comprising
 a phase detector receiving inputs from a frequency divider and a reference source and generating an output based on phase differences between said inputs,
 a voltage controlled oscillator (VCO) for generating VCO output signals based on said output of said phase detector,
 a divider receiving said VCO output signals as an input and providing a divided version of said VCO output signals as an output, said divided version of said VCO output signals having a period of $1/F_v$,
 a divisor control circuit for supplying a divisor signal to said divider, said divisor control circuit comprising an adder for summing at least one integer input, $N_{int}$, and at least one sequence of values, S, where the average value of S is given by avg(S)=C/D, said C/D being a desired value for a fractional part of said divisor, said at least one sequence of values S generated by a fractional sequence generator comprising
 a cascaded plurality of n-bit accumulators, $A_i$, each adding a multi-bit input word to a previously accumulated value to provide a new n-bit sum, $N_i$, and a carry-out signal, $CO_i$, when said $N_i$ overflows said n-bit accumulator,
 an adder providing said values, S, for each period $1/F_v$, where S is equal to a sum of weighted increments and decrements, each increment and decrement associated with a respective selectively delayed replica of one of said $CO_i$, and wherein
 each $A_i$ further comprises an offset circuit for incrementing said $N_i$ by a programmable function of D in response to each occurrence of said $CO_i$, and
 a recombination network comprising
 an adder providing an output equal to the sum of weighted increments and decrements, each increment and decrement associated with a respective selectively delayed one of said $CO_i$, and
 a plurality of delay elements for selectively delaying said $CO_i$, $CO_1$ experiencing zero delay, $CO_i$, i>1 experiencing delays of 1, . . . units of delay.

12. The F-N synthesizer of claim 11 wherein said programmable function is given by $2^n-D$.

13. The F-N synthesizer of claim 12 wherein $2^n-D$ is not a power of 2.

14. The F-N synthesizer of claim 11 wherein each $A_i$ comprises
 a n-bit register storing said $N_i$, and
 a first n-bit adder for forming the sum of C and
 (i) $N_i$ when $CO_i=0$, or
 (ii) $N_i+2n-D$ when $CO_i=1$.

15. The F-N synthesizer of claim 14 further comprising
 a second n-bit adder having said $N_i$ as a first input,
 a multiplexer responsive to a 1 value for said $CO_i$ for supplying a value of $2^n-D$ as a second input to said second n-bit adder, and responsive to a 0 value for said $CO_i$ for supplying a zero value as a second input to said second n-bit adder.

* * * * *